United States Patent [19]

Kim et al.

[11] 3,757,175

[45] Sept. 4, 1973

[54] COMPOSITE INTEGRATED CIRCUITS WITH COPLANAR CONNECTIONS TO SEMICONDUCTOR CHIPS MOUNTED ON A SINGLE SUBSTRATE

[76] Inventors: Chang Soo Kim, 7669 Villa Maria, North Syracuse, N.Y. 13212; Gerald G. Palmer, 105 Hiawatha Tr., Liverpool, N.Y. 13088

[22] Filed: Jan. 6, 1971

[21] Appl. No.: 104,299

Related U.S. Application Data

[63] Continuation-in-part of Ser. No. 687,278, Dec. 1, 1967, abandoned.

[52] U.S. Cl...... 317/234 R, 317/234 E, 317/234 N, 317/235 F

[51] Int. Cl. ............................................ H01l 5/00

[58] Field of Search...................... 317/234, 235, 101

[56] References Cited

UNITED STATES PATENTS

| | | | |
|---|---|---|---|
| 3,463,970 | 8/1969 | Gutzwiller | 317/234 |
| 3,206,647 | 9/1965 | Kahn | 317/101 |
| 3,262,022 | 7/1966 | Caracciolo | 317/101 |

*Primary Examiner*—John W. Huckert
*Assistant Examiner*—E. Wojciechowicz
*Attorney*—Richard V. Lang, Carl W. Baker, Frank L. Neuhauser, Oscar B. Waddell and Joseph B. Forman

[57] ABSTRACT

Integrated circuits in which individual semiconductor chips exhibiting diverse electrical and compositional characteristics may in combination with thin or thick film passive components be applied to a single flat supporting dielectric substrate, wherein there are provided readily formed connections to the chips and an ease of registration of the chips with respect to one another and to conductive patterns carried by the substrate. The chips are bonded to the dielectric substrate and embedded in a smooth layer of chemically inert, high quality insulating material adhering to the substrate, said chips being applied with the metalized surface thereof contiguous with that of the insulating material so that a continuous supporting structure is formed for said connection. In one specific embodiment, the conductive patterns are deposited both on the substrate surface and on the surface of the insulating material, the patterns being connected by extending portions thereof through the insulating layer.

20 Claims, 14 Drawing Figures

INVENTORS:
CHANG SOO KIM,
GERALD G. PALMER,
BY Marvin L. Goldenberg
THEIR ATTORNEY.

INVENTORS:
CHANG SOO KIM,
GERALD G. PALMER,

BY Marvin Goldenberg
THEIR ATTORNEY.

COMPOSITE INTEGRATED CIRCUITS WITH COPLANAR CONNECTIONS TO SEMICONDUCTOR CHIPS MOUNTED ON A SINGLE SUBSTRATE

The present invention is a continuation in part of U.S. application Ser. No. 687,278 filed Dec. 1, 1967, and subsequently abandoned.

BACKGROUND OF THE INVENTION

1. Field of the Invention

The invention relates to the field of integrated circuits and, more specifically, to that part of the field wherein a number of active components in the form of semiconductor chips are combined on a single substrate with passive film components for providing a wide range of circuit functions. As used in the present discussion, semiconductor chips are intended to include within their meaning all forms of miniaturized electronic components in packaged or quasi packaged form, such as monolithic chips, beam lead devices, hybrid devices, etc., which can be mounted and interconnected on a single substrate.

2. Description of the Prior Art

In recent years much work has been performed in the field of integrated circuits directed to the goal of fabricating micro-miniature electronic circuits of high complexity on a single supporting substrate. These efforts are generally divided into two categories, one termed a monolithic approach and the other a hybrid approach. In the monolithic a number of active devices, such as transistors and diodes, and resistive and capacitive passive components are fabricated from a single wafer of semiconductor material by means of conventional semiconductor processing techniques, i.e., diffusion, alloying, evaporation, etc. The various active and passive components are interconnected by metalization normally evaporated on the wafer surface. Photolithographic techniques are employed in the processing to achieve extremely small dimensions of all components. Accordingly, by means of this approach, a high degree of miniaturization can be accomplished.

However, the monolithic approach does have a number of inherent limitations. It is basically an inflexible process. Thus, should any single component on a monolithic chip prove bad, either the entire chip must be replaced or a discretionary interconnection of the components must be made from which the bad component or components are excluded. The latter, however, adds considerable complexity to automated processing techniques. It may be appreciated that the noted inflexibility of the of the monolithic circuit becomes particularly burdensome for large scale integration. As a further limitation, since both active and passive components are fabricated from a single piece of semiconductor material, normally silicon, restrictions exist as to the choice of components in the circuit design. Thus, the active components must all be of a similar type so that, for example, both tunnel diodes and transistors cannot be fabricated on a single monolithic chip, nor can many different type transistors, etc. Further, only a limited range of resistance and capacitance, and no inductance at all, can be provided.

In addition, isolation between components is normally provided by back-biased p-n junctions, which isolation is often insufficient, especially for high frequency operation, for example above 100 MHz. More recently dielectric isolation has been employed for improving the degree of isolation between components. Dielectric isolation is accomplished either by merely etching excess silicon material around the active components or by replacing the silicon with a dielectric material such as glass. This form of isolation, however, requires special processing techniques.

With respect to the hybrid approach, in general, individual semiconductor chips, each of which may include one or more active components normally processed using monolithic techniques, are applied to a supporting substrate and the individual chips interconnected. The outstanding advantages of this approach are that dissimilar active devices can be combined in an integral circuit on a single substrate, and chips can be tested and replaced individually as required. Further, using either thin film or thick film techniques, a relatively wide range of passive components of a resistive, capacitive or inductive type can be formed on the substrate and incorporated in the interconnection structure.

However, because the individual chips have a finite thickness on the order of several mils, a problem is presented with respect to providing connections between the chips and the conductor strips on the supporting substrate. Presently, the most common procedure is to apply the semiconductor chips to the supporting substrate with the metalization up. Extremely fine wires, normally of gold, are then connected to the contact pads on the chip and to terminals on the substrate by ultrasonic bonding, compression welding or other techniques known to the art. This procedure must be performed by hand and is uneconomical.

In a more recent development, complete conductive patterns are first formed on the surface of the supporting substrate and the semiconductor chips are then applied to the substrate metalization down, commonly known as the "flip-chip" method. In this method tiny metal balls are formed either on the chip or on terminals of the substrate and contact is made between the chips and the conductive patterns by soldering at the points where the balls are formed. Whereas the flip-chip method is satisfactory for relatively large dimensioned structures, it cannot readily be employed for high density, high resolution work, or where a relatively large number of solder connections are to be made.

SUMMARY OF THE INVENTION

It is accordingly a principal object of the present invention to combine in a novel structure the outstanding features of existing monolithic technology with the outstanding features of existing hybrid technology while at once obviating many of the limitations associated with these technologies when taken individually.

It is a further object of the invention to provide a novel integrated circuit structure having individual semiconductor chips exhibiting diverse electrical and compositional characteristics applied to a single supporting substrate in combination with film processed passive circuit components wherein connection to said chips may be accurately performed by surface metalization techniques conventionally employed in monolithic processing.

It is another object of the invention to provide a novel integrated circuit structure as above described which permits the applied chips to include a number of semiconductor materials, such as silicon, germanium and gallium arsenide, etc., and the active circuit components of said module to be of different types including a variety of transistors, diodes and tunnel diodes, etc.

It is still another object of the invention to provide a novel integrated circuit structure as above described which permits a number of materials to be used as the supporting substrate.

It is a further object of the invention to provide a novel integrated circuit structure as described above wherein batch processing techniques can be employed for fabricating the passive components and the entire interconnection arrangement.

It is a still further object of the invention to provide a novel integrated circuit structure as described above wherein registration of the semiconductor chips relative to the interconnection structure is readily accomplished.

It is yet a further object of the invention to provide a novel integrated circuit structure as described above which incorporates multilayer interconnections.

It is another object of the invention to provide a novel integrated circuit structure in which numerous semiconductor chips can be combined with film processed passive components on a single substrate to achieve for a given packing density a degree of circuit complexity not heretofore possible.

It is still another object of the invention to provide a novel integrated circuit structure in which a semiconductor chip can be permanently bonded to a supporting substrate with its metalization facing away from the substrate and wherein electrical connection can be made to the chip without requiring wire leads or similar suspended connecting structure.

It is a further object of the invention to provide a novel integrated circuit structure wherein monolithic chips are permanently bonded to a single supporting substrate and etched as desired either prior or subsequent to being bonded for accommodating an improved electrical connection to the chips as well as for obtaining dielectric isolation between the chips.

It is a still further object of the invention to provide a suitable bonding material for the novel integrated circuit structure described above.

These and other objects of the invention are accomplished by a structure which includes a rigid dielectric substrate for supporting a number of semiconductor chips having metalized contact electrodes and an insulating material overlaying one surface of the substrate in which material said chips are embedded. The substrate further supports conductor strips having terminal electrodes intended to be connected to said contact electrodes. The chips are bonded to the substrate with said contact electrodes in registry with said terminal electrodes and with the contact and terminal electrodes contiguous with the surface of said insulating material. Metalization deposited on the surface of the insulating material extending between the contact and terminal electrodes forms electrical connections to the chips. The electrical connections may be formed by a photolithographic process. The insulating material must be chemically inert so as to be highly etch resistant; it must be capable of being strongly bonded at heating temperatures that are not excessive, in particular, lower than the eutectic temperature of the metalization on the chips and on the substrate; it should be a low loss dielectric material; it should have stable electrical and chemical properties; and it should have plastic mechanical properties, yielding under stress without rupture. Fluorinated ethylene propylene, (FEP) Teflon, has been found to be an extremely desirable insulating material for this purpose.

In one specific embodiment of the invention, conductive strips are deposited directly on the surface of the supporting substrate with a smooth layer of said insulating material overlaying the substrate surface and said chips. The terminal electrodes are provided by mesa formations at various points on the conductive strips, the mesas extending through the insulating material to be contiguous with said surface. The semiconductor chips are embedded in the insulating layer face up, with the contact electrodes also contiguous with the surface of the insulating material so as to provide continuously supported connections between the contact electrodes on the chips and the formed mesa structures. Additional mesas, not part of the interconnecting structure, are also formed on the substrate which assist in registering the chips as they are embedded.

In accordance with a further aspect of the invention, a multilayer interconnection structure is provided for accommodating crossover connections of the conductor strips. Accordingly, mesa formations are constructed on either side of each conductor strip that is to be crossed, the mesas being connected together by the deposition of metalization on the surface of the embedding layer.

In accordance with another embodiment of the invention, the semiconductor chips are applied face down and the insulating layer is in film form. The chips may then be etched so as to expose metalization of the contact electrodes and connection can then be readily made between said contact electrodes and the interconnection structure terminal electrodes of the conductor strips, which for a thin film insulating layer are deposited on the surface of the insulating layer.

BRIEF DESCRIPTION OF THE DRAWING

The specification concludes with claims particularly pointing out and distinctly claiming the subject matter which is regarded as the invention. It is believed, however, that both as to its organization and method of operation, together with further objects and advantages thereof, the invention may be best understood from the description of the preferred embodiments, taken in connection with the accompanying drawings in which:

DESCRIPTION OF THE PREFERRED EMBODIMENTS

Figures 1A, 1B, 2A, 2B, 3A, 3B, 4A, 4B:
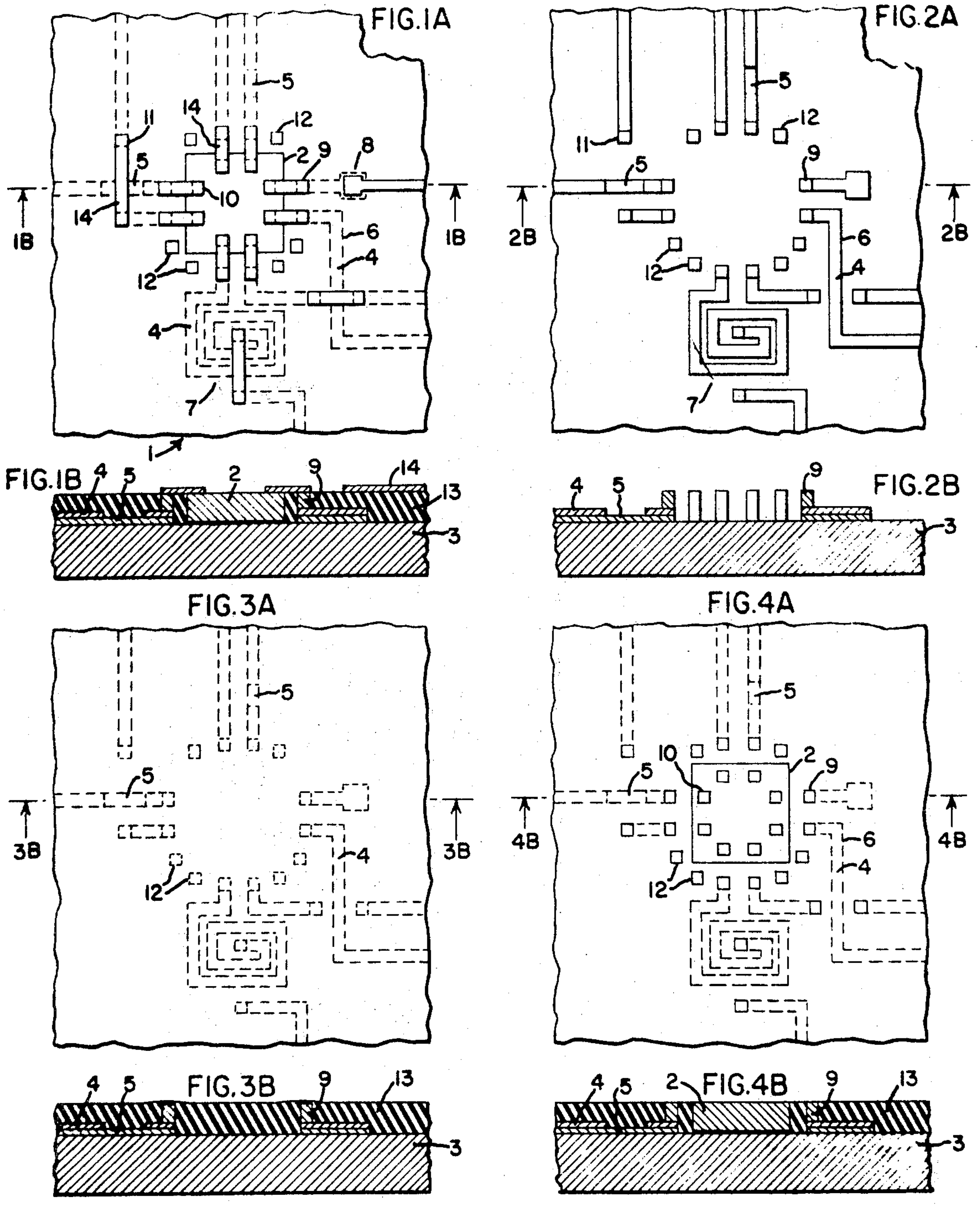
FIG. 1A is a plan view of an integrated circuit structure segment, in accordance with a first embodiment of the invention, illustrating a single semiconductor chip and its external connection.
FIG. 1B is a cross sectional view of FIG. 1A taken along the plane 1B—1B.
FIG. 2A is a plan view of the structure of FIG. 1A after the completion of a first stage in the fabrication process with a conductive pattern overlaying the substrate surface.
FIG. 2B is a cross sectional view of FIG. 2A taken along the plane 2B—2B.
FIG. 3A is a plan view of the structure of FIG. 1A after a second stage in the fabrication process with a bonding material over the conductive pattern.
FIG. 3B is a cross sectional view of FIG. 3A taken along the plane 3B—3B.
FIG. 4A is a plan view of the structure of FIG. 1A after a third stage in the fabrication process with the semiconductor chip embedded within the layer of insulating material.
FIG. 4B is a cross sectional view of FIG. 4A taken along the plane 4B—4B.

With reference to FIG. 1A, there is illustrated in plan view an integrated circuit structure segment 1 in accordance with a first embodiment of the invention. For purposes of explanation, only a portion of a complete circuit structure, greatly enlarged, has been shown to facilitate explanation of the invention, including a single semiconductor chip 2 mounted on a supporting substrate 3, identified in FIG. 1B, in combination with interconnecting conductors and passive circuit components. The invention offers complete flexibility in bonding numerous different type semiconductor chips to a common substrate selected from a number of materials and for employing a wide range of passive components in the interconnecting structure. As specific features of the illustrated structure, it makes possible continuously supported connections directly to the chip, which can be readily performed by photolithographic techniques commonly employed in monolithic fabrication; it accommodates crossover connections in the interconnection structure; and additional processing of the chip, such as etching to provide dielectric isolation, can be performed subsequent to mounting of the chip on the substrate.

The supporting substrate 3 is a dielectric material of good insulating properties, typically alumina ($Al_2O_3$), beryllia or glass for both low and microwave frequency applications. The embodiment under consideration employed alumina. Where relatively large values of inductance are to be provided to the peripheral circuitry, for example above 75 nanohenries, ceramic magnetic materials exhibiting a wide range of magnetic properties, such as ferrite or garnet, may be used as the substrate. Ferrite or granet materials can also be employed for microwave applications. The thickness of the substrate is typically on the order of twenty to thirty mils.

Overlaying the substrate surface are formed thin layer conductive patterns which include a high conductivity material 4 such as gold, aluminum or copper, and a resistive material 5, such as chromium or nichrome. The conductive patterns serve to interconnect the semiconductor chip 2 to other chips common to the substrate 3 and to external terminals on the substrate 3, which are not shown in FIG. 1A. Strips 6 of the high conductivity material 4 serve as conductors. In a configuration of close electromagnetic coupling, the conductor strips may provide inductance as shown with respect to the inductor component 7. The conductive material 4 may be also formed in a relatively wide area to serve as one electrode of a capacitance component, shown with respect to the capacitor 8.

The resistive material 5 directly overlays the substrate surface and the high conductivity material 4 overlays portions of the resistive material, as best illustrated in the cross sectional view of FIG. 1B taken along a plane 1B—1B in FIG. 1A. It is noted that for purposes of illustration the view of FIG. 1B is not in precise proportion. The conductive patterns formed of the highly conductive material 4 and the resistive material 5 are processed using conventional additive or subtractive techniques.

A plurality of terminal electrodes 9 are constructed at end points on the conductor strips for making electrical connection directly to contact electrodes 10 on the semiconductor chip 2. The electrodes 9 are mesa structures that extend above the conductive patterns, as seen in FIG. 1B. Further mesa structures 11 are formed at intermediate points on the conductor strips 6 for providing crossover connections. In addition, registration mesas 12 are formed on the substrate surface with the same thickness as the masas 9, which position the semiconductor chip 2 on the substrate surface with linear and radial accuracy.

A smooth layer of insulating material 13 overlays the conductive patterns with the mesa formations extending through said layer so as to be substantially flush with the surface. In the embodiment under consideration the thickness of the layer 13 is about two mils. The semiconductor chip 2 is embedded within the dielectric layer 13 so as to be firmly bonded to the substrate. The chip 2 is embedded face up with the contact pads 10 substantially flush with the surface of the embedding material 13. Although the conventional aluminum metalization for the contact pads may be suitable for many applications, it is preferable that the chip have a non-oxidizing metalization, of which gold is the most common, for providing the most reliable electrical connection thereto.

A fluorinated ethylene propylene (FEP) Teflon has been employed as the embedding material 13. It is a thermoplastic material having a number of properties that make it eminently suitable for the present use. The material can be strongly bonded at heating temperatures that are below the eutectic temperatures of the metalization on the substrate surface and on the semiconductor chip, and yet remains solid over a suitable range of operating temperatures. It possesses extremely good dielectric properties over a wide range of frequencies. FEP Teflon is chemically inert so as to be highly resistance to most etch solutions. While subject to shrinkage upon cooling, which varies from 5 to 30 percent, it accommodates strains well within the material so that once the bond is formed bonded surfaces remain secure. Further, the material is highly moisture resistant and exhibits good temperature stability for its electrical and chemical properties. It is recognized that other materials within the family of thermoplastics, and also outside, which possess comparable properties to those described can also be employed for the embedding layer as appropriate to a given application. For example, a number of the fluoroplastics appear to be suitable materials, such as chlorotrifluorethylene under the trade names of Kel-F or Plaskon, polyvinylidene fluoride under the name of Kynar or polyphenylene oxide.

The semiconductor chip 2 can be one of a number of chips commerically available, or be a specially fabricated chip, providing operation ranging from a simple circuit function to a systems function. It may include from a single to a large number of active components, such as transistors, diodes or tunnel diodes, directly connected together or connected in combination with passive components. Although the invention is contemplated to have principal application relative to highly miniaturized chips, and in particular of the monolithic type, it is also useful with respect to providing interconnection for hybrid or other integrated circuit devices of somewhat larger dimensions than monolithic. The present embodiment contemplates a chip dimension of about 40 mils square and a thickness of one and one half to two mils. Commercial monolithic chips which are normally 7 to 10 mils thick can readily be lapped to achieve this thickness. It should be clear, however, that for purposes of the invention neither the internal construction, the electrical arrangement nor the overall dimensions of the chips are critical.

Overlaying the surface of the insulating material 13 are formed further conductor strips 14 which connect the mesa electrodes 9 to the contact pads 10 for providing electrical connection between the semiconductor chip 2 and the peripheral circuitry. In addition, the conductor strips 14 extend between the mesa electrodes 11 for providing crossover connections as may be required. Also formed on the surface of the insulating material 13 is the second electrode of the capacitor 8. It is noted that relatively small capacitance is exhibited by the capacitor 8 because of the thickness of the dielectric layer 13. However, considerably larger capacitance can readily be provided on the surface of the substrate or bonding layer by comparable techniques.

By referring to FIGS. 2A through 4B, fabrication of the present integrated circuit structure will be considered in greater detail. In the plan view of FIG. 2A and the cross sectional view of FIG. 2B taken along the plane 2B—2B in FIG. 2A, is shown the structure 1 at a first stage in the fabrication when the conductive patterns and the mesa formations have been completed on the surface of the substrate 3. In one processing operation, the substrate 3 initially has a continuous layer of the resistive material 5, in the present case chromium, deposited over the entire surface. The resistive layer is applied by conventional metalization processing, typically evaporation, to a thickness of from 500 to 1000 angstroms. The entire surface of the material 5 is coated with a photoresist material, e.g., Kodak Ortho Resist, which is a negative photoresist. By conventional optical procedures used in photolithography, a first exposure is made through a photo mask which defines a pattern of the chormium to be retained, said pattern including all highly conductive areas as well as the resistive areas. The etch solution employed in the developing process is one which selectively attacks the unexposed chromium. Thus, all but the retained pattern of chromium is removed down to the substrate.

The surface is then cleaned and a second coat of photoresist material is applied. A second exposure is made through a photo mask which defines a pattern of the highly conductive material to be deposited, in the present case, gold, Thus, windows are formed in the photoresist layer and gold evaporated through them to form the conductor strips and other highly conductive areas with a thickness of about 5 to 7 microns.

The conductor and resistive strips can also be formed by a subtractive process wherein continuous layers of chromium or gold are deposited onto the substrate. The gold is first selectively etched down to the chromium by photolithographic techniques to define a pattern including all highly conductive areas. The chormium is then selectively etched to form the resistive strips.

The mesa structures are formed of a highly conductive metal capable of being applied to a thickness of several mils; copper is a suitable metal for this purpose. Accordingly, the surface thus far formed is cleaned and a thin film of copper evaporated over the entire area. A thick film of copper is then electroplated over the surface commensurate with the height at which the mesas are to be constructed. In the embodiment under consideration, copper is electroplated to a thickness on the order of 2 mils. The surface is then cleaned and the photoresist is applied. A third photo mask, which defines a pattern of the mesa structures is next employed and the copper selectively exposed through said mask. In developing the mesa formations, an etch solution is employed that attacks the unexposed copper, but not the gold or chromium. In the present embodiment of the invention the electrode mesas 9 and 11 and the registration mesas 12 are the same height. The mesas 12 are constructed directly on the dielectric substrate 3 and are electrically isolated from the remainder of the structure.

In the following steps of the process, the embedding layer is applied to the substrate over the conductive patterns and mesa formations. In the application of FEP Teflon as the bonding layer, a FEP dispersion primer material is first applied to the surface. The primer is fused by heating to about 370°C.

A second approach to achieving an adherent layer of FEP with lower temperature processing is through the use of a coupling agent such as gamma-aminopropyltriethoxysilane, N-beta-(Aminoethyl)-gamma-aminopropyltrimethoxysilane, or a combination of the two. It has been found that either of these materials will provide very strong bonds between FEP on the one hand and an alumina substrate, to copper electrode structures, particularly where the electrodes have been previously oxidized, oxidized silicon, (such as one encounters on the surface of the semiconductor chip) and a relatively large number of resistive-conductive materials. Of these materials, aluminum, palladium and gold and many thick film materials may be included. The circuit is immersed for a few minutes in an aqueous solution of the silane made up of one part silicon per 100 parts water after which it is rinsed and dried. By this process a continuous film of coupling agent a few molecules in thickness is achieved.

Following the application of the primer or coupling agent, a sheet of FEP Teflon having a thickness equal to the height of the mesa formations is then pressed at approximately 320°C and a pressure of between 100 to 500 psi. At this stage in the fabrication the structure appears as illustrated in the plan view of FIG. 3B taken along the plane 3B—3B in FIG. 3A.

The semiconductor chip 2 is then placed in registry with the mesa formations 12 and pressed, face up, as shown in the plan view of FIG. 4A and the cross sectional view of FIG. 4B. In order that there be provided an accurate registration of the chip contact electrodes 10 with the terminal electrodes 9, the metalization pattern on the chip must be precisely referenced to the edges of the chip. Embedding of the chip is accomplished with a platen heated to about 320° and exerting a pressure of between 100 to 500 psi so that the contact electrodes are flush with the surface of the Teflon and the mesa formations extend through said surface and are also flush therewith. As the chip is pressed into the heated Teflon, the molten material spreads laterally around the mesa structures. A fine grinding operation may be performed to remove any film of Teflon that may have remained on the surface of the mesa structures. Details of a specific process employed for embedding the semiconductor chip so as to be substantially flush with the Teflon surface is fully described in a copending application entitled "A Method of Embedding Semiconductor Chips Within a Dielectric Layer so as to be Flush with Surface", Ser. No. 687,195, filed Dec. 1, 1967 by Gerald G. Palmer, and assigned to the assignee of the present invention.

The structure so far described may be alternately achieved by bonding the chip to the substrate by eutectic bonding, solder, or high temperature organic adhesives. The Teflon layer is then applied as described above leaving the chips and mesas embedded therein. Any residues of Teflon over contact pads on the chips and mesas are removed by similar abrasive techniques.

In the final step of the process a highly conductive, preferably non-oxidizing metal, typically gold, is evaporated over the entire surface thus far formed to a thickness of about one micron. A photoresist material is then deposited over the gold. A final exposure is then made through a final photo mask which contains the conductive pattern to be formed on the surface of the Teflon layer. The pattern includes that of the conductor strips 14 and the second capacitor electrode. The surface conductive pattern, formed upon the application of an etch solution which attacks the unexposed gold, is illustrated in FIGS. 1A and 1B. In this process it is desirable that the metalization on the chip be substantially thicker than the evaporated gold so that the etching procedure is not unduly critical.

An additive process can alternatively be employed for forming the surface conductive pattern wherein the photoresist layer is first formed over the entire surface and exposed through a photo mask for providing windows in the photoresist layer where the conductive pattern is to be. Gold is then evaporated through the windows to complete the process.

Only conductive strips have been shown on the insulating layer surface in FIGS. 1A and 1B. However, it should be clear that all of the passive components can also be formed on this surface. Further, although only a limited number and form of passive components have been included for purposes of illustration, a wide range of such components may be employed in accordance with the state of the art.

Figure 5A:
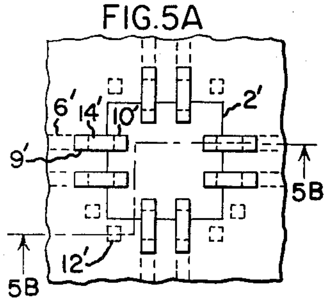
FIG. 5A is a plan view of an embedded chip and surrounding mesa formations, illustrating a second embodiment of the invention.
Figure 5B:
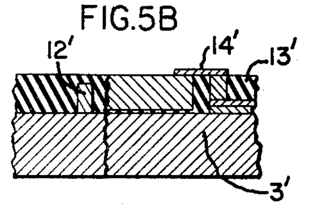
FIG. 5B is a cross sectional view of FIG. 5A taken along the interrupted plane 5B—5B.

FIGS. 5A and 5B are plan and interrupted plane cross sectional views, respectively, of an alternate embodiment of the foregoing structure. Components corresponding to those previously illustrated are identified by the same reference characters but with added prime notations. Accordingly, a chip 2' is embedded in an insulating layer 13' and mounted on a dielectric substrate 3'. Only that portion of the peripheral structure which includes the registration and terminal electrode mesas 12' and 9', respectively, conductor strips 6' on the substrate surface and conductor strips 14' connecting electrodes 9' to contact pads 10' are shown. In accordance with the present embodiment the registration mesa formations 12' are constructed to a height less than the electrode meas formations 9'. Accordingly, the registration mesas 12' are slightly below the surface of the bonding layer 13'. The advantage of this construction is that electrical isolation of the mesas 12' from the surface connections is built into the structure.

Figure 6A:
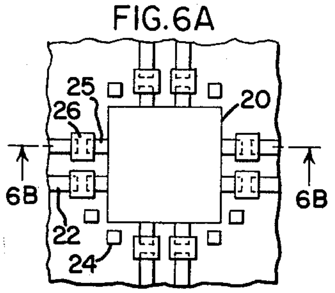
FIG. 6A is a plan view of an integrated circuit structure segment in accordance with a further embodiment of the invention.
Figure 6B:
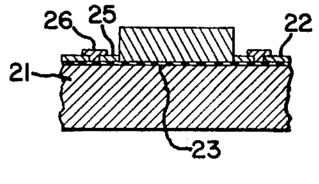
FIG. 6B is a cross sectional view of FIG. 6A taken along the plane 6B—6B.

A third embodiment of the invention is illustrated in the plan view of FIG. 6A and the cross sectional view of FIG. 6B taken along the plane 6B—6B in FIG. 6A in which a semiconductor chip 20 is mounted onto a supporting dielectric substrate 21 of similar composition to that previously considered, and an electrical connection is made between the chip and conductor strips 22 carried by the substrate 3. In this embodiment the chip 20 is bonded to the surface of the substrate by means of a thin film adhesive material 23 approximately several microns thick. An FEP Teflon primer is a suitable adhesive material. The FEP Teflon primer may be applied by being sprayed onto the substrate surface or applied by a dropper and spun off. It is then fused to the surface at a temperature of about 370°. The conductive strips 22 overlaying the adhesive film 23 are typically of a gold metalization applied by conventional deposition processes, such as by evaporation of a continuous layer followed by selective etching through a photo mask, similar to that previously described with respect to the first embodiment of the invention. The chip 20 is applied to the adhesive surface of the substrate face down and adhered at a temperature of about 320°C and a pressure of about 100 to 500 psi applied by a platen. Registration mesas 24 are formed over the substrate surface for providing accurate linear and radial registration of the chip 20.

The semiconductor chip is applied with its contact pads 25 in a coplanar relationship with the conductor strips 22. The contact electrodes 25 are exposed from the upper side by a selective etching process which may be performed either before or after the chip is bonded to the substrate. Etching subsequent to bonding offers the advantage of the contact pads being firmly supported by the body of the chip during the bonding process. If the chip is etched prior to bonding, a conventional beam lead process may be employed in which the exposed contact electrodes 25 are stiffened by being made with appreciable thickness, on the order of one half mil. The contact electrodes 25 are connected to the conductor strips 22 by abbreviated conductor strips 26 which overlay the ends of strips 22 and electrodes 25, employing a photolithographic process similar to that previously described. In this embodiment, passive components may be deposited on the surface of film 23.

Figure 7:
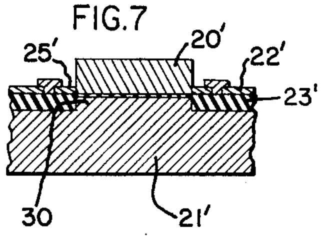
FIG. 7 is a modified embodiment of FIG. 6B.

It may be desirable to provide a broad mesa structure 30 of dielectric material having a thickness on the order of one to two mils on the substrate surface directly beneath the chip 20, as illustrated in the cross sectional view of FIG. 7 which is a modification of FIG. 6B. The mesa structure 30 permits employment of a bonding layer 23' of at least the thickness of the broad mesa structure, and still have the contact electrodes 25' of the mounted chip overlaying the surface of the bonding layer and in coplanar relationship with the conductor strips 22'. The broad mesa structure may be formed directly from the substrate during its fabrication. This structure permits passive components to be applied as with respect to the first embodiment.

Figure 8:
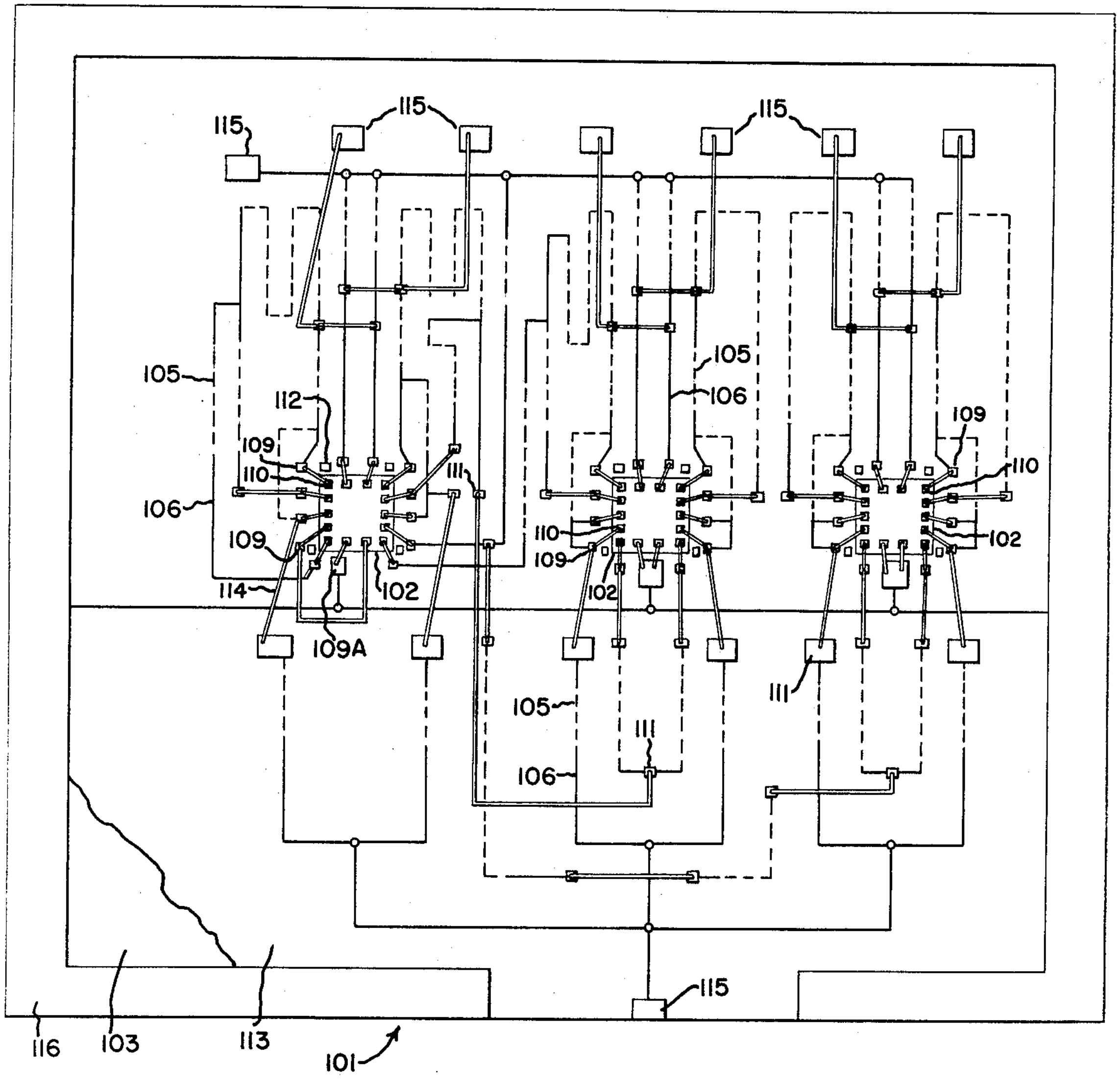
FIG. 8 is a plan view of a digital integrated circuit structure constructed in accordance with the first embodiment of the invention.

In FIG. 8 there is illustrated a plan view of an integrated circuit structure 101 which performs a digital operation. As will be seen the structure corresponds to that described in the first embodiment of the invention illustrated in FIGS. 1A through 4B. It should be pointed out that the illustrated structure, although performing a complete circuit function, is nevertheless on a relatively modest scale and serves principally as one specific example of the form of large scale integration made possible by the present invention.

Three semiconductor chips 102 are illustrated which are mounted on a supporting dielectric substrate 103 by being embedded face up within insulating layer 113. In the operable embodiment of the invention being considered the semiconductor chips are of monolithic construction and each include several transistor components. The dielectric substrate is of alumina, and FEP Teflon is employed as the embedding insulating layer. Overlaying the substrate surface are formed resistive strips 105, which are of chromium, and conductor strips 106, which are of gold, these strips being fabricated by evaporation of metals and selective etching as previously described. The chromium strips 105 are schematically illustrated by single broken lines and the gold strips 106 by single solid lines, although as actually fabricated these strips are applied in a well known manner with varying widths in accordance with the resistance values assigned to the resistive strips. A plurality of terminal electrode mesa structures 109, here of electroplated copper, are constructed around the chips 102 for making electrical connections directly to contact pads 110 on the chips. The mesa structures 109 are constructed at end points on the conductor strips 106 as well as directly on the substrate 103. A plurality of mesa structures 111 are also constructed at intermediate points on the conductor strips 106 for providing crossover connections. In addition, registration mesa formations 112 are constructed directly on the substrate surface for accurately positioning the chips 102 so that the contact pads 110 are in precise registration with the terminal electrodes 109. In the illustrated embodiment electrode mesa structures 109A provide a common ground connection to the chips and also serve as registration mesas.

Additional mesa formations 115 serve as external terminals of the overall structure for providing input and output connections to the circuit. Finally, a mesa formation 116 is constructed around the periphery of the structure which serves a dual function, one being to act as a common ground for the circuit. Since all the mesa structures are constructed to be at the same level as the embedding layer 113, the mesas 116 can also be employed as a stop in the embedding process in which a platen is used to press the chips 102 into the bonding layer 113.

Conductor strips 114 evaporated over the surface of the embedding layer make continuously supported electrical connections between the terminal electrode mesas 109 and the contact electrodes 110. Further conductor strips 114 make electrical connections to mesa formations 111 for providing crossovers of the conductive patterns formed on the substrate surface. As described with respect to the foregoing embodiments, the conductive strips 114 are evaporated onto the surface of the embedding layer and selectively etched by means of a photolithographic process for providing an accurate and automated formation of these strips. Accordingly, the entire interconnection structure can be fabricated by batch processing techniques.

For good electrical connections the underlying surfaces should meet certain geometric requirements. The contact electrodes on the semiconductor chips, the terminal electrodes distributed over the substrate, and the surface of the insulating embedding layer support the metalization. These surfaces have been earlier characterized as "contiguous", "flush", "coplanar." Other expressions such as "in registry with", "the same height as", "commensurate height", "equal height" have been used to characterize the heights of the contact electrodes relative to the upper surfaces of the terminal electrodes.

Thus, while the term "coplanar" has been intended to designate the surface conformation of these underlying surfaces upon which the connections are formed, and the connections themselves, it should be evident that the geometric concept is unduly restrictive in any practical context. In a practical context, tolerances in the surface of the substrate, in the processing of the layers, shrinkage, etc., force the supporting surface to depart from precise coplanarity. In a practical context, this quality is perhaps better expressed by the term "smooth" which implies a tolerance to some degree of surface imperfection. In the context of the present invention, this surface smoothness implies a continuity of surface which, while made up of discrete segments of contiguous or substantially coplanar segments, is sufficiently smooth or continuous to be compatible with conventional surface metalization techniques.

Although the invention has been described with respect to a limited number of specific embodiments for the purpose of clear and complete disclosure, the invention is not intended to be thus narrowly construed. It is recognized that numerous modifications can be made to the structure disclosed by those skilled in the art which would not exceed the basic invention taught. For example, direct electrical connections between chips by the surface conductor strips can be readily made. The embedding layer may be made considerably thicker than disclosed, for example on the order of 10 mils, so as to permit large dimensioned chips to be embedded. Futher, an extension of the presently disclosed concepts may be realized by performing a second level integration wherein the disclosed integrated circuit structures are themselves mounted as chips upon a further substrate and interconnected.

Accordingly, the principle of the invention herein set forth may be appreciated to be applicable in providing numerous integrated circuit structures wherein many different type semiconductor chips are combined with passive components of different types and values for performing a wide range of circuit operations. The appended claims are meant to include within their ambit all modifications and variations of the structure and methods herein described which can reasonably be found to fall within the true scope of the invention.

What is claimed as new and desired to be secured by Letters Patent of the United States is:

1. An integrated circuit structure comprising:

a. a dielectric substrate having a substantially planar surface area, b. a smooth layer of insulating material adherent to and overlaying said substrate, c. an electronic component having a number of contact electrodes on one face thereof, embedded in said insulating material with said contact electrodes elevated with respect to said substantially planar surface area and contiguous with the surface of said insulating material, d. a deposited conductive pattern supported on said dielectric substrate having a number of terminal members contiguous with the surface of said insulating layer, and e. a first plurality of strips of deposited electrically conductive film material overlaying and continuously supported along their length between said terminal members and said contact electrodes by said insulating layer for providing electrical connections thereto.

2. An integrated circuit structure as in claim 1 wherein said insulating layer is composed of a plastic material.

3. An integrated circuit structure as in claim 1 that includes registration means arranged around the site on the substrate to which said electronic component is bonded for providing linear and radial registration of the electronic component on said substrate.

4. An integrated circuit structure as in claim 1 wherein at least part of said conductive pattern includes further strips of electrically conductive material deposited directly on the substrate beneath said layer of insulating material, said terminal members being formed by a first plurality of terminal mesa structures which are built upon the further conductive strips and extend through said insulating layer so as to be contiguous with said insulating layer surface.

5. An integrated circuit structure as in claim 4 wherein certain of said further conductive strips are discontinuous as deposited on said substrate, which includes a second plurality of terminal mesa structures built upon said discontinuous conductive strips and a second plurality of strips of electrically conductive material overlaying said insulating layer that make electrical connections between said second plurality of terminal mesa structures for providing crossover connections within said conductive pattern.

6. An integrated circuit structure as in claim 3 wherein said registration means includes a plurality of registration mesa structures built upon said substrate.

7. An integrated circuit structure as in claim 5 wherein said terminal mesa structures are thick film formations of electrically conductive material that have been electroplated by photolithographic techniques.

8. An integrated circuit structure as in claim 6 wherein a plurality of electronic components are bonded to said substrate and interconnected by said conductive pattern, said conductive pattern including a plurality of film type passive components.

9. An integrated circuit structure as in claim 8 wherein said insulating layer is composed of a fluorinated plastic that is highly chemically inert.

10. An integrated circuit structure as in claim 9 wherein said layer of insulating material is at least one mil thick and said electronic components having a thickness slightly less than that of said layer are embedded within said layer face up with said contact electrodes contiguous with said insulating layer surface.

11. An integrated circuit structure as in claim 2 wherein said substrate includes a relatively broad mesa formation, said electronic component being bonded at the surface of said insulating layer in registration with said broad mesa formation, said electronic component being bonded face down with said contact electrodes of said insulating layer surface.

12. An integrated circuit structure as in claim 1 wherein said layer of insulating material is on the order of several microns, said electronic component being bonded at the surface of said insulating layer face down with said contact electrodes on said surface.

13. An integrated circuit structure as in claim 12 wherein said conductive pattern is deposited on said insulating layer surface, said terminal members being composed of said portions of said conductive patterns.

14. An integrated circuit structure as in claim 13 wherein a plurality of electronic components are bonded to said substrate and interconnected by said conductive pattern, said conductive pattern including a plurality of film type passive components.

15. An integrated circuit structure as in claim 14 wherein said dielectric layer is composed of a fluorinated plastic that is highly chemically inert.

16. An integrated circuit structure comprising:

a. a dielectric substrate having a substantially planar surface area, b. an electronic component having a number of contact electrodes, said electronic component being mounted on said substrate so that said contact electrodes are upwardly facing and elevated with respect to said substantially planar surface area, c. a layer of insulating material in intimate contact with and surrounding said electronic component and contiguous with the surfaces of said contact electrodes, d. strips of deposited electrically conductive film material continuously supported along their length by said insulating material for making electrical connection to said contact electrodes, and e. a deposited conductive pattern supported on said substrate and having conductive means extending through said layer so as to be contiguous with the surface of said insulating material for making electrical connection between said strips and said conductive pattern.

17. An integrated circuit structure as in claim 16 wherein said conductive means are terminal mesa structures which are formed upon said conductive pattern.

18. An integrated circuit structure as in claim 17 which includes registration means in the form of an embossed structure arranged around the site on the substrate to which said electronic component is bonded for providing linear and radial registration of the electronic component on said substrate.

19. An integrated circuit structure as in claim 18 wherein said dielectric material has adhesive properties and serves to bond said electronic component to said substrate.

20. An integrated circuit structure as in claim 19 wherein said dielectric material is a fluorinated plastic that is highly chemically inert.

* * * * *